United States Patent [19]

Hyakutake

[11] Patent Number: 5,146,180
[45] Date of Patent: Sep. 8, 1992

[54] VARIABLE GAIN AMPLIFIER

[75] Inventor: Junichi Hyakutake, Itami, Japan

[73] Assignee: Mitsubishi Denki Kabushiki Kaisha, Tokyo, Japan

[21] Appl. No.: 663,308

[22] Filed: Mar. 1, 1991

[30] Foreign Application Priority Data

Mar. 13, 1990 [JP] Japan .................................. 2-63061

[51] Int. Cl.$^5$ .............................................. H03G 3/30
[52] U.S. Cl. ..................................... 330/254; 330/279
[58] Field of Search ................. 330/85, 127, 129, 254, 330/278, 279

[56] References Cited

U.S. PATENT DOCUMENTS 5,034,701 7/1991 Debroux ............................. 330/254

OTHER PUBLICATIONS

"Bipolar and Mos Analog Integrated Circuit Design", Alan B. Grebene, pp. 458–469.

"Analysis and Design of Analog Integrated Circuits", Paul R. Gray and Robert G. Meyer, pp. 560–571.

Primary Examiner—James B. Mullins
Attorney, Agent, or Firm—Oblon, Spivak, McClelland, Maier and Neustadt

[57] ABSTRACT

An internal control voltage outputted from a voltage comparator controls the gain of a second amplifier. The output from the second amplifier, supplied to one input of the voltage comparator, is compared with an external control voltage supplied to the other input thereof. Such a negative feedback loop enables the gain of the second amplifier to be completely proportional to the external control voltage over the full variable gain range. The internal control voltage outputted from the voltage comparator is also inputted to a first amplifier, which includes a first variable gain portion having the same variable gain characteristic as a second variable gain portion of the second amplifier. Therefore, the gain of the first amplifier is completely proportional to the external control voltage over the full variable gain range as well as the gain of the second amplifier.

19 Claims, 11 Drawing Sheets

VARIABLE GAIN AMPLIFIER

BACKGROUND OF THE INVENTION

1. Field of the Invention

The present invention relates to a variable gain amplifier capable of controlling a gain by a control voltage and more particularly to a variable gain amplifier in which a gain is completely proportional to a control voltage.

2. Description of the Prior Art

In a circuit which amplifies an analog signal with a desired variable gain, for example, it is convenient to employ a variable gain amplifier in which the gain is completely proportional to a control voltage in order to set the gain digitally without difficulty by a command from a computer and the like.

Figure 11:
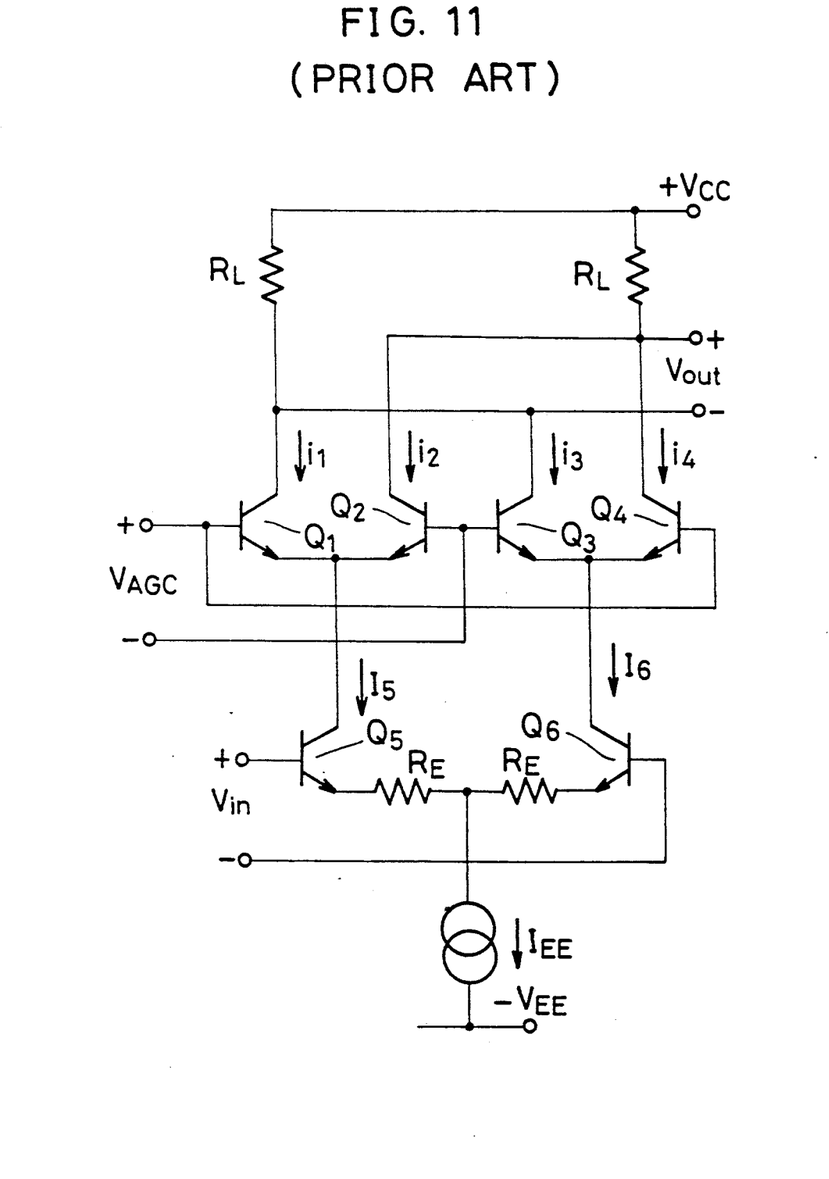
FIG. 11 is a circuit diagram showing a conventional variable gain amplifier.

FIG. 11 is a circuit diagram showing a conventional variable gain amplifier of this kind, which is disclosed in the document, Paul R. Gray and Robert G. Meyer "Analysis and Design of Analog Integrated Circuit" published by John Wiley & Sons, Inc., in 1977. The variable gain amplifier uses a well-known double balanced modulator, in which a constant current $I_{EE}$ is divided into currents $I_5$ and $I_6$ by a differential pair of transistors $Q_5$ and $Q_6$ in accordance with an input voltage $v_{in}$. The current $I_5$ is divided into currents $i_1$ and $i_2$ by a differential pair of transistors $Q_1$ and $Q_2$ in accordance with a control voltage $V_{AGC}$, and the current $I_6$ is divided into currents $i_3$ and $i_4$ by a differential pair of transistors $Q_3$ and $Q_4$ in accordance with the control voltage $V_{AGC}$. An output voltage $v_{out}$ is supplied by the voltage drop generated at resistors $R_L$.

The gain $A_v$ of the variable gain amplifier is expressed by the following equations:

$$A_v = v_{out}/v_{in} \quad (1)$$
$$= (R_L/R_E) \cdot \tanh(V_{AGC}/V_T)$$

$$V_T = kT/q \quad (2)$$

k: Boltzmann's constant
T: absolute temperature
q: electronic charge

Figure 12:
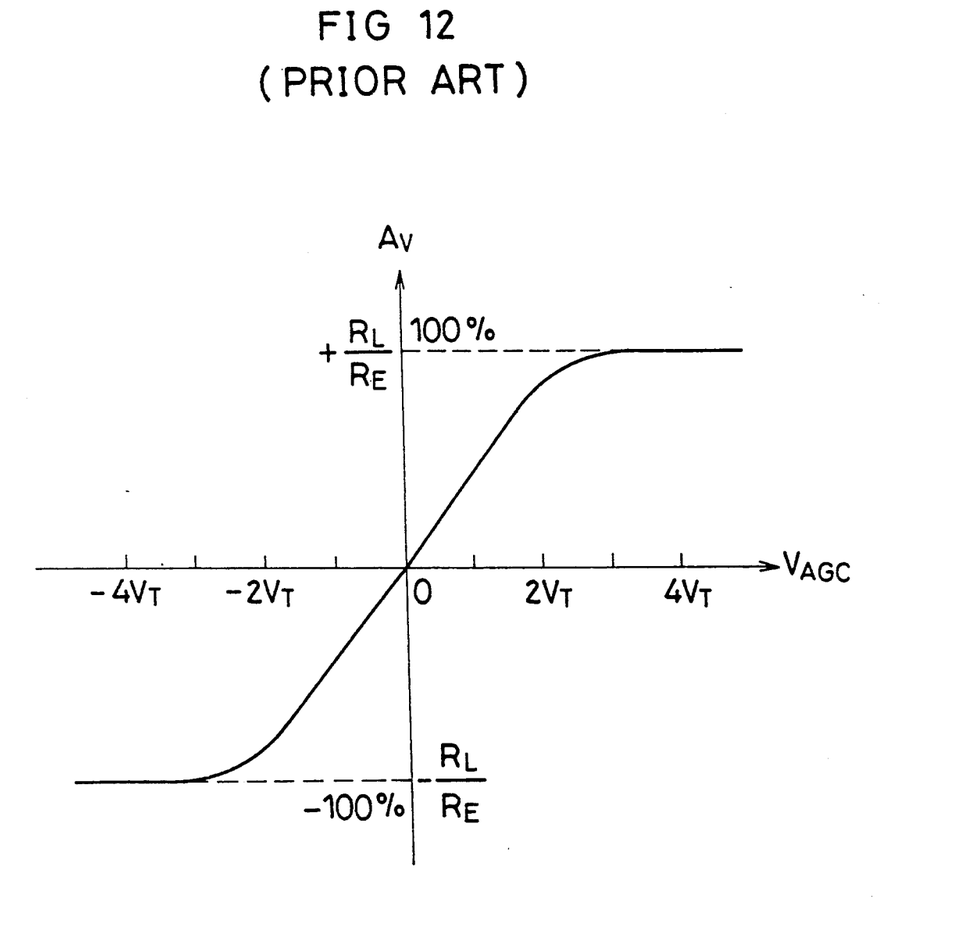
FIG. 12 is a graph showing the variable gain characteristic thereof.

FIG. 12 is a graph showing the change in the gain $A_v$ with respect to the control voltage $V_{AGC}$. The first quadrant of the graph is a region as a non-inverting amplifier, and the third quadrant thereof is a region as an inverting amplifier.

In the conventional variable gain amplifier as above constructed, the gain $A_v$ is variable in proportion to the control voltage $V_{AGC}$ in the almost full region of the gain $A_v$ between $-100\%$ and $+100\%$, as is apparent from the graph of FIG. 12. However, in the regions of the gain $A_v$ around $+100\%$ and $-100\%$, the gain $A_v$ does not change in proportion to the control voltage $V_{AGC}$. Therefore, when the variable gain amplifier shown in FIG. 11 is used as an amplifier in which the control voltage and the gain are completely proportional to each other, the regions of the gain $A_v$ around $+100\%$ and $-100\%$ are not available.

SUMMARY OF THE INVENTION

According to the present invention, a variable gain amplifier comprises first input means for receiving an input signal to be amplified, second input means for receiving an external control voltage, signal applying means for applying a reference signal, a first amplifier, including a first variable gain portion for providing a gain corresponding to an internal control voltage, for amplifying the input signal from the first input means in accordance with the gain of the first variable gain portion to output as an output signal the input signal amplified, a second amplifier, including second variable gain portion for providing a gain corresponding to the internal control voltage, the second variable gain portion having the same variable gain characteristic as the first variable gain portion for amplifying the reference signal from the signal applying means in accordance with the gain of the second variable gain portion to output the reference signal amplified, and a voltage comparator, one input thereof receiving the external control voltage from the second input means, the other input thereof receiving an output from the second amplifier and an output voltage thereof being applied as the internal control voltage to the first and second variable gain portions of the first and second amplifiers, thereby for forming a negative feedback loop with the second amplifier.

According to the present invention, an internal control voltage outputted from a voltage comparator controls the gain of a second amplifier. The output from the second amplifier, supplied to one input of the voltage comparator, is compared with an external control voltage supplied to the other input thereof. Such a negative feedback loop enables the gain of the second amplifier to be completely proportional to the external control voltage over the full variable gain range. The internal control voltage outputted from the voltage comparator is also inputted to a first amplifier, which includes a first variable gain portion having the same variable gain characteristic as a second variable gain portion of the second amplifier Therefore, the gain of the first amplifier is completely proportional to the external control voltage over the full variable gain range as well as the gain of the second amplifier.

In other words, there are provided a first amplifier for amplifying a signal and a second amplifier for detecting a gain. A negative feedback loop with a voltage comparator enables the gain of the second amplifier to change in complete proportion to an external control voltage. The variable gain characteristics of the first and second amplifiers ar Ⓡadapted to be equal to each other, thereby the gain of the first amplifier changing so as to follow the gain of the second amplifier completely. Therefore, the gain of the first amplifier for amplifying a signal changes in complete proportion to the external control voltage, and, as a result, attainable is a variable gain amplifier in which the gain is completely proportional to the control voltage over the full variable gain range.

Accordingly, it is an object of the present invention to provide a variable gain amplifier in which a gain is completely proportional to a control voltage over the full variable gain range.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
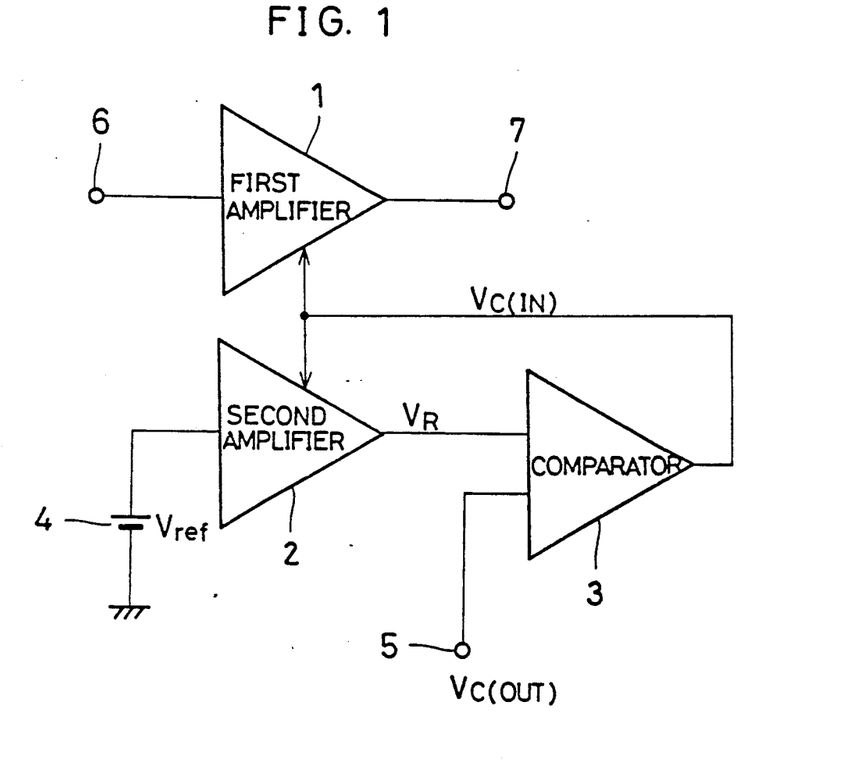
FIG. 1 is a block diagram showing one embodiment of a variable gain amplifier according to the present invention.

FIG. 1 is a block diagram showing one preferred embodiment of a variable gain amplifier according to the present invention. The variable gain amplifier comprises first and second amplifiers 1 and 2, a voltage comparator 3 and a reference DC voltage source 4. A constant voltage of the reference DC voltage source 4 is inputted to the second amplifier 2 to be amplified with a gain corresponding to an internal control voltage $V_{C(IN)}$. An output voltage $V_R$ from the second amplifier 2 is supplied to a first input of the comparator 3. An external control voltage $V_{C(OUT)}$ is applied to a second input of the comparator 3 through an input terminal 5. The comparator 3 compares the voltages $V_{C(OUT)}$ and $V_R$ of the first and second inputs to output the compared result as an internal control voltage $V_{C(IN)}$. The internal control voltage $V_{C(IN)}$ is inputted to the first and second amplifiers 1 and 2. The first amplifier 1 amplifies a desired input signal supplied to an input terminal 6 with a gain corresponding to the internal control voltage $V_{C(IN)}$ to output it to an Output terminal 7.

In the preferred embodiment, variable gain characteristics of the first and second amplifiers with respect to the internal control voltage $V_{C(IN)}$ are equally set. Such a set is easily achieved by adopting the same circuitry for the first and second amplifiers and using elements having the same electrical characteristics as an element of the circuit. In particular, the achievement is easier when the circuit is integrated.

The first amplifier 1 is used for amplifying the desired input signal supplied to the input terminal 6 with a completely proportional gain to the external control voltage $V_{C(OUT)}$ inputted from outside. The second amplifier 2 is used for detecting or monitoring the gain of the first amplifier 1 moment by moment. That is, since the constant voltage is inputted to the second amplifier 2 from the reference DC voltage source 4, the value of the output voltage $V_R$ from the second amplifier 2 acts as an information indicating the momentary gain of the second amplifier 2 (equal to the gain of the first amplifier 1). The output voltage $V_R$ from the second amplifier 2 having such an implication is inputted to the first input of the comparator 3, in which it is compared with the external control voltage $V_{C(OUT)}$ inputted to the second input of the comparator 3. The compared result is fed back to the second amplifier 2 as an internal control voltage $V_{C(IN)}$, so that the gain of the second amplifier 2 is changed. The output voltage $V_R$ from the second amplifier 2 is operated so as to be constantly equal to the external control voltage $V_{C(OUT)}$ through such a negative feedback loop. That is, the following equation holds:

$$V_R = V_{C(OUT)} \qquad (3)$$

Furthermore, if the gain of the second amplifier 2 and the voltage value of the reference DC voltage source 4 are taken as $A_2$ and $V_{ref}$ respectively, Equation (4) holds.

$$V_R = A_2 \cdot V_{ref} \qquad (4)$$

Equations (3) and (4), Equation (5) is obtained.

$$A_2 = V_{C(OUT)}/V_{ref} \qquad (5)$$

Since $V_{ref}$ is a constant, the gain $A_2$ of the second amplifier 2 is found completely proportional to the external control voltage $V_{C(OUT)}$.

On the other hand, the variable gain characteristics of the first and second amplifiers with respect to the internal control voltage $V_{C(IN)}$ are set to be equal, as described above. If the gain of the first amplifier 1 is taken as $A_1$, Equation (6) constantly holds.

$$A_1 = A_2 \qquad (6)$$

From Equations (5) and (6), the following equation can be obtained:

$$A_1 = V_{C(OUT)}/V_{ref} \qquad (7)$$

Thus, the gain $A_1$ of the first amplifier 1 changes also in complete proportion to the external control voltage $V_{C(OUT)}$. The gain $A_2$ of the second amplifier 2 changes in complete proportion to the external control voltage $V_{C(OUT)}$ through the negative feedback loop including the comparator 3. While following the gain $A_2$, the gain $A_1$ of the first amplifier changes also in complete proportion to the external control voltage $V_{C(OUT)}$. Thus, the gain $A_1$ of the first amplifier 1 for amplifying the desired input signal supplied to the input terminal 6 is variable in complete proportion to the external control voltage $V_{C(OUT)}$ over the full variable gain range.

Figure 2:
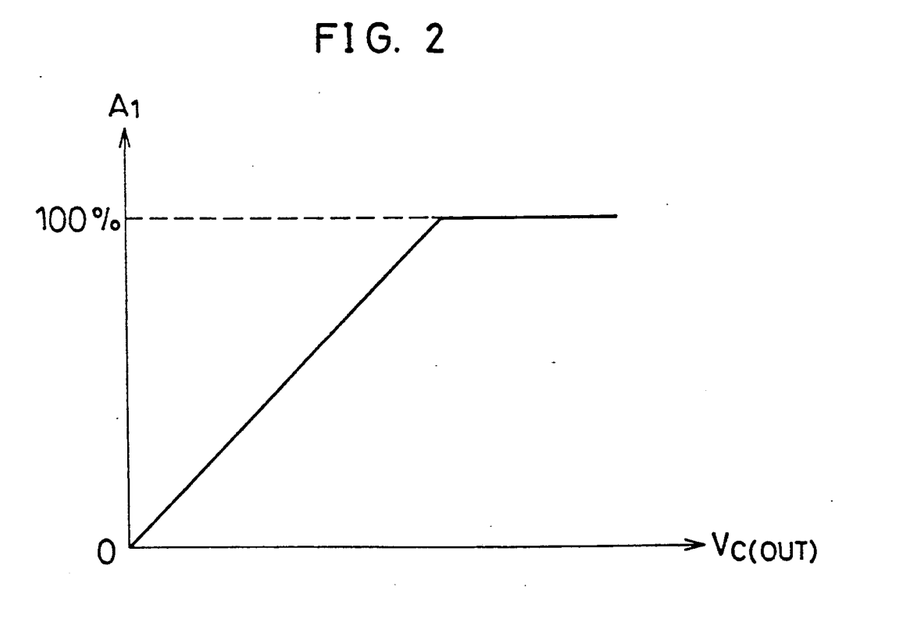
FIG. 2 is a graph showing the variable gain characteristic thereof.

FIG. 2 is a graph showing the change in the gain $A_1$ of the first amplifier 1 with respect to the external control voltage $V_{C(OUT)}$. As the external control voltage $V_{C(OUT)}$ increases, the gain $A_1$ of the first amplifier 1 changes completely linearly from 0% to 100%, as shown in FIG. 2.

The first and second amplifiers 1 and 2 need not have linear variable gain characteristics with respect to the internal control voltage $V_{C(IN)}$. Required is only monotonic increase or decrease in the gains $A_1$ and $A_2$ of the first and second amplifiers 1 and 2 in accordance with the increase in the internal control voltage $V_{C(IN)}$. Practically, the variable gain characteristics of the first and second amplifiers 1 and 2 are optimally designed according to the signal type supplied to the input terminal 6 to be amplified. In the case of the monotonical increase in the variable gain characteristic of the second amplifier 2, the first input of the comparator 3 connected to the second amplifier 2 is a negative input, and the second input thereof connected to the input terminal 5 is a positive input, to produce a negative feedback. In the case of the monotonical decrease, vice versa, the first input is positive and the second input is negative.

Figure 3:
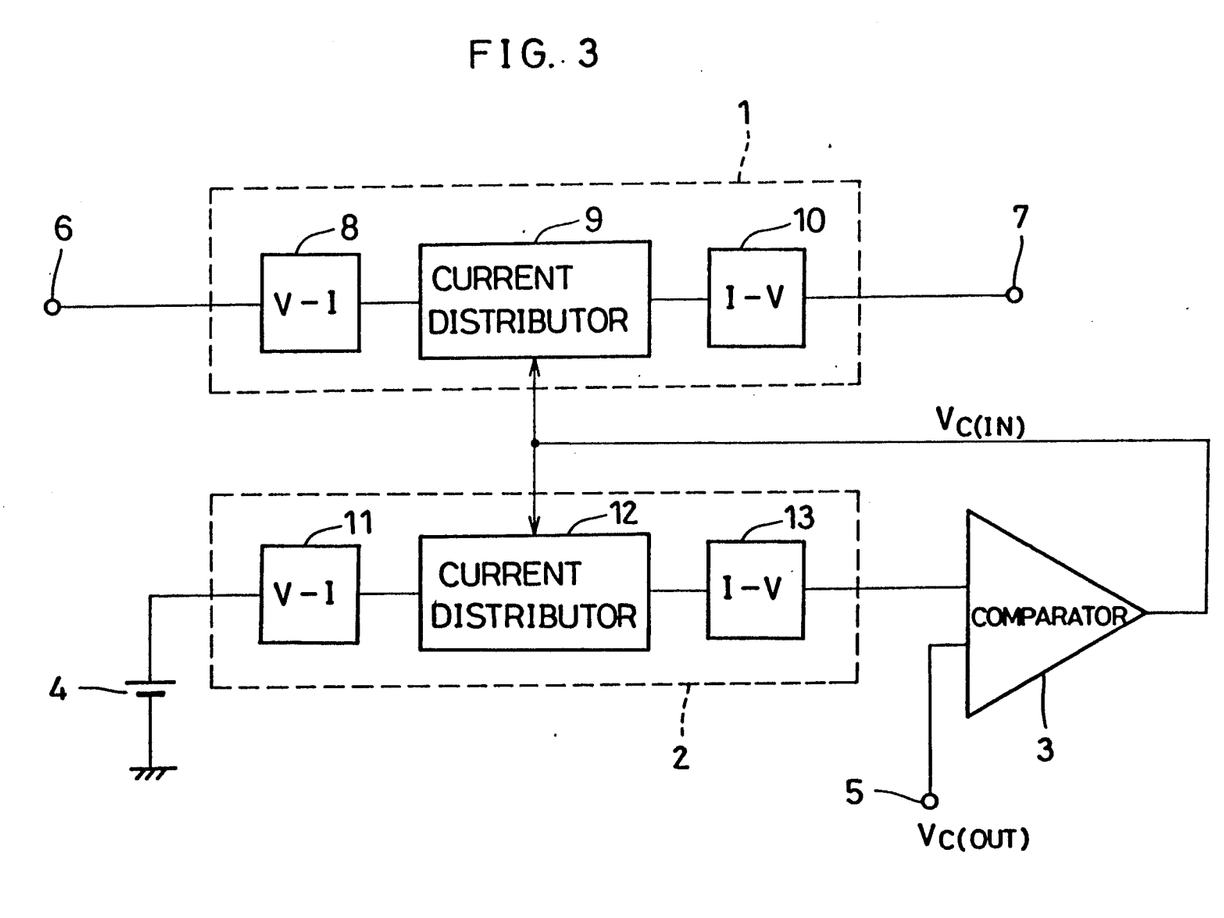
FIG. 3 is a block diagram showing an embodiment in which the variable gain amplifier of FIG. 1 comprises current distribution type amplifiers.

FIG. 3 is a block diagram showing the variable gain amplifier in FIG. 1 in which amplifiers having current distribution type variable gain portions are used as first and second amplifiers and 2. The first amplifier 1 comprises a voltage-to-current converter 8 for voltage-to-current (V-I) converting the input signal supplied to the input terminal 6, a current distributor (or a variable gain portion) 9 for distributing the output current from the voltage-to-current converter 8 according to the internal control voltage $V_{C(IN)}$ and a current-to-voltage converter 10 for current-to-voltage (I-V) converting the output current from the current distributor g to output the output voltage to the output terminal 7. Similarly, the second amplifier 2 comprises a voltage-to-current converter 11 for voltage-to-current converting the constant voltage outputted from the reference DC voltage source 4, a current distributor (or a variable gain portion) 12 for distributing the output current from the voltage-to-current converter according to the internal control voltage $V_{C(IN)}$ and a current-to-voltage converter 13 for current-to-voltage converting the output current from the current distributor 12 to supply the output voltage to the first input of the comparator 3. The external control voltage $V_{C(OUT)}$ is supplied to the second input of the comparator 3 through the input terminal 5. The output voltage from the comparator 3 is supplied to the current distributors 9 and 12 of the first and second amplifiers 1 and 2 as an internal control voltage $V_{C(IN)}$.

The gains of the amplifiers 1 and 2 change depending on the change in current distribution factor at the current distributors 9 and 12 according to the internal control voltage $V_{C(IN)}$. In the preferred embodiment, the equality in current distribution characteristic (or variable gain characteristic) at the current distributors 9 and 12 which serve as variable gain portions meets the requirement. Conversion characteristics of the voltage-to-current converters 8 and 11 and the current-to-voltage converter 10 and 13 need not necessarily be equal to each other.

Figure 4:
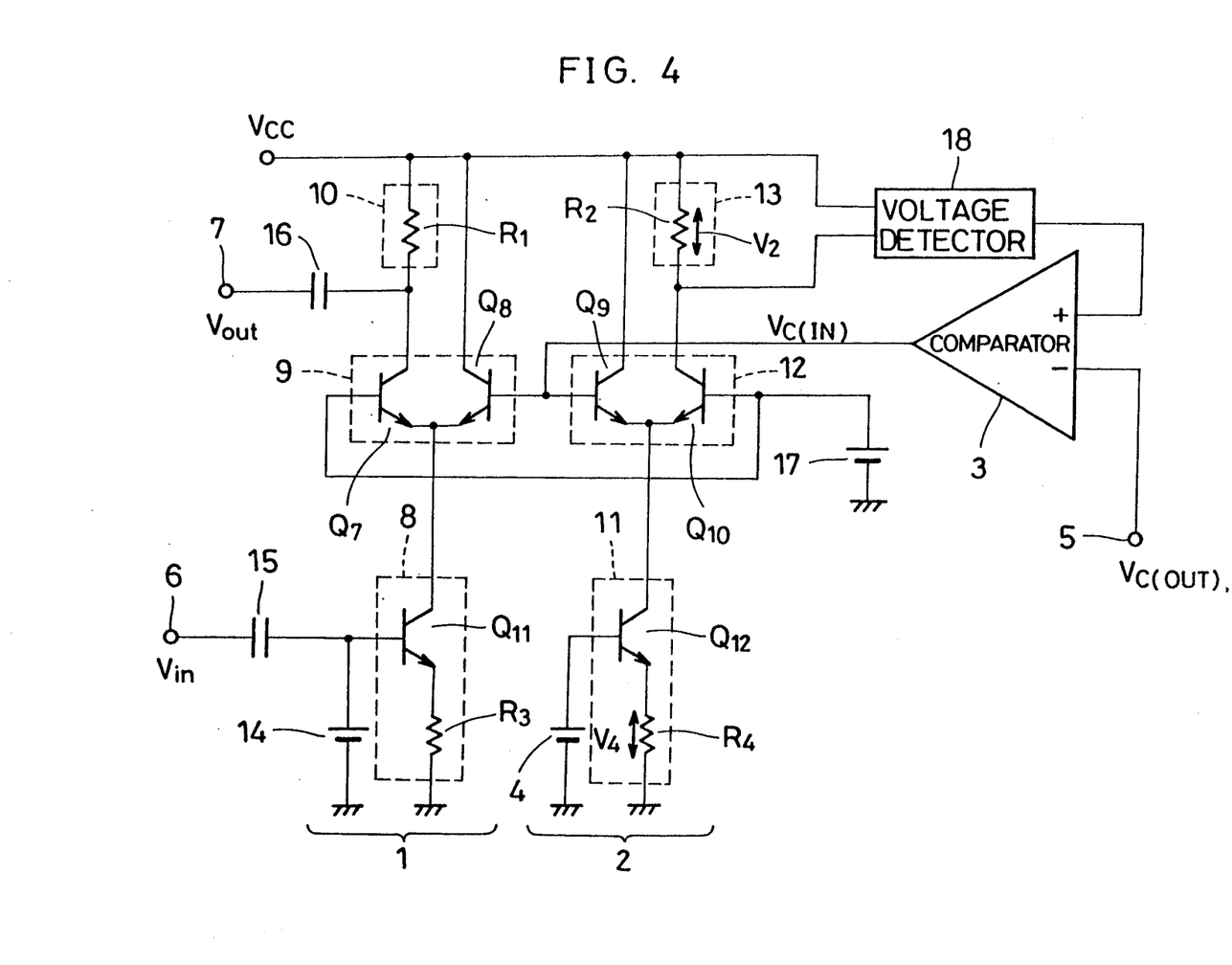
FIGS. 4-9 are circuit diagrams showing illustrative circuit examples of the variable gain amplifier shown in FIG. 3.

FIG. 4 is a circuit diagram showing an illustrative circuit of an AC amplifier according to the preferred embodiment of FIG. 3. In the first amplifier 1, the voltage-to-current converter 8 comprises a transistor $Q_{11}$ and a resistor $R_3$. The emitter of the transistor $Q_{11}$ is grounded through the resistor $R_3$, and the base thereof is connected to the input terminal 6 through a coupling capacitance 15 and to a bias voltage source 14. The current distributor (or the variable gain portion) 9 comprises a differential pair of transistors $Q_7$ and $Q_8$. The emitters of the transistors $Q_7$ and $Q_8$ are connected to the collector of the transistor $Q_{11}$ in common. The base of the transistor $Q_7$ is connected to a reference voltage source 17, and that of the transistor $Q_8$ is connected to the output of the comparator 3. The collector of the transistor $Q_8$ is connected to a power source $V_{CC}$. The current-to-voltage converter 10 comprises a resistor $R_1$. One end of the resistor $R_1$ is connected to the power source $V_{CC}$, and the other end thereof is connected to the collector of the transistor $Q_7$ and to the output terminal 7 through a coupling capacitance 16.

On the other hand, in the second amplifier 2, the voltage-to-current converter 11 comprises a transistor $Q_{12}$ and a resistor $R_4$. The emitter of the transistor $Q_{12}$ is grounded through the resistor $R_4$, and the base thereof is connected to the reference DC voltage source 4. The current distributor (or the variable gain portion) 12 comprises a differential pair of transistors $Q_9$ and $Q_{10}$. The emitters of the transistors $Q_9$ and $Q_{10}$ are connected to the collector of the transistor $Q_{12}$ in common. The base of the transistor $Q_9$ is connected to the output of the comparator 3, and that of the transistor $Q_{10}$ is connected to the reference voltage source 17 in common with the first amplifier 1. The collector of the transistor $Q_9$ is connected to the power source $V_{CC}$. The current-to-voltage converter 13 comprises a resistor $R_2$. One end of the resistor $R_2$ is connected to the power source $V_{CC}$, and the other end thereof is connected to the collector of the transistor $Q_{10}$. A voltage detector 18 for detecting a voltage drop value at the resistor $R_2$ is connected to the both ends of the resistor $R_2$. The output from the voltage detector 18 is supplied to the positive input of the comparator 3. The external control voltage $V_{C(OUT)}$ is applied to the negative input of the comparator 3 through the input terminal 5.

In order to equalize the variable gain characteristics at the current distributors (or the variable gain portions) 9 and 12, the transistors $Q_7$ and $Q_8$ in the current distributor 9 and the transistors $Q_9$ and $Q_{10}$ in the current distributor 12 consist of the elements having completely the same sizes and electrical characteristics. However, all of four transistors $Q_7$–$Q_{10}$ need not be the same, and it is enough that the corresponding transistors $Q_7$, $Q_{10}$ and $Q_8$, $Q_9$ are respectively the same. Therefore, the above requirement can be achieved without difficulty by forming the respectively corresponding transistors $Q_7$, $Q_{10}$ and $Q_8$, $Q_9$ adjacent to each other on a pattern if the circuit is to be integrated.

The current distribution factors (or the gains) at the current distributors (or the variable gain portions) 9 and 12 change according to the internal control voltage $V_{C(IN)}$ outputted from the comparator 3. In the preferred embodiment, as the internal control voltage $V_{C(IN)}$ increases, the current distribution factor with respect to the output current to the current-to-voltage converters 10 and 13 decreases monotonically. Accordingly, to produce the negative feedback, the output voltage from the current-to-voltage converter 13 is fed back to the positive input of the comparator 3.

The current distribution factors at the current distributors 9 and 12 are supposed as follows:

$$Q_7:Q_8 = Q_{10}:Q_9 = x:(1-x) \quad (8)$$
$$(0 \leq x \leq 1)$$

When the voltage drop values at the resistors $R_2$ and $R_4$ are taken as $V_2$ and $V_4$, Equation (9) is obtained from Equation (8).

$$(V_r/R_4)\cdot x = V_2/R_2 \quad (9)$$

By virtue of the negative feedback loop including the comparator 3, a feed back is produced so as to equalize the both inputs of the comparator 3, and thereby Equation (10) holds.

$$V_2 = V_{C(OUT)} \quad (10)$$

From Equations (9) and (10), Equation (11) can be obtained.

$$x = \frac{V_{C(OUT)}}{V_4} \cdot \frac{R_4}{R_2} \quad (11)$$

On the other hand, an AC signal $v_{in}$ is inputted to the input terminal 6. If only the signal components (or the AC components) thereof are taken into consideration, $$(v_{in}/R_3)\cdot x = v_{out}/R_1 \quad (12)$$

can be obtained where $v_{out}$ is an AC signal component outputted from the output terminal 7. From Equation (12), Equation (13) is obtained.

$$v_{out}/v_{in} = (R_1/R_3) \quad (13)$$

Accordingly, the gain $A_1$ of the first amplifier 1 is found by the use of Equation (11).

$$A_1 = v_{out}/v_{in} \quad (14)$$
$$= \frac{V_{C(OUT)}}{V_4} \cdot \frac{R_1}{R_3} \cdot \frac{R_4}{R_2}$$

Since $V_4$ and $R_1$–$R_4$ are constants, it is found that the gain $A_1$ of the first amplifier 1 is completely proportional to the external control voltage $V_{C(OUT)}$ over the full variable gain range. In addition, the gain is expressed in the form including resistance ratios ($R_1/R_3$) and ($R_4/R_2$), and thereby the variation in resistance value caused by the variation in manufacturing process or the fluctuation in resistance value due to temperature change can be cancelled when the circuit is integrated.

Figure 5:
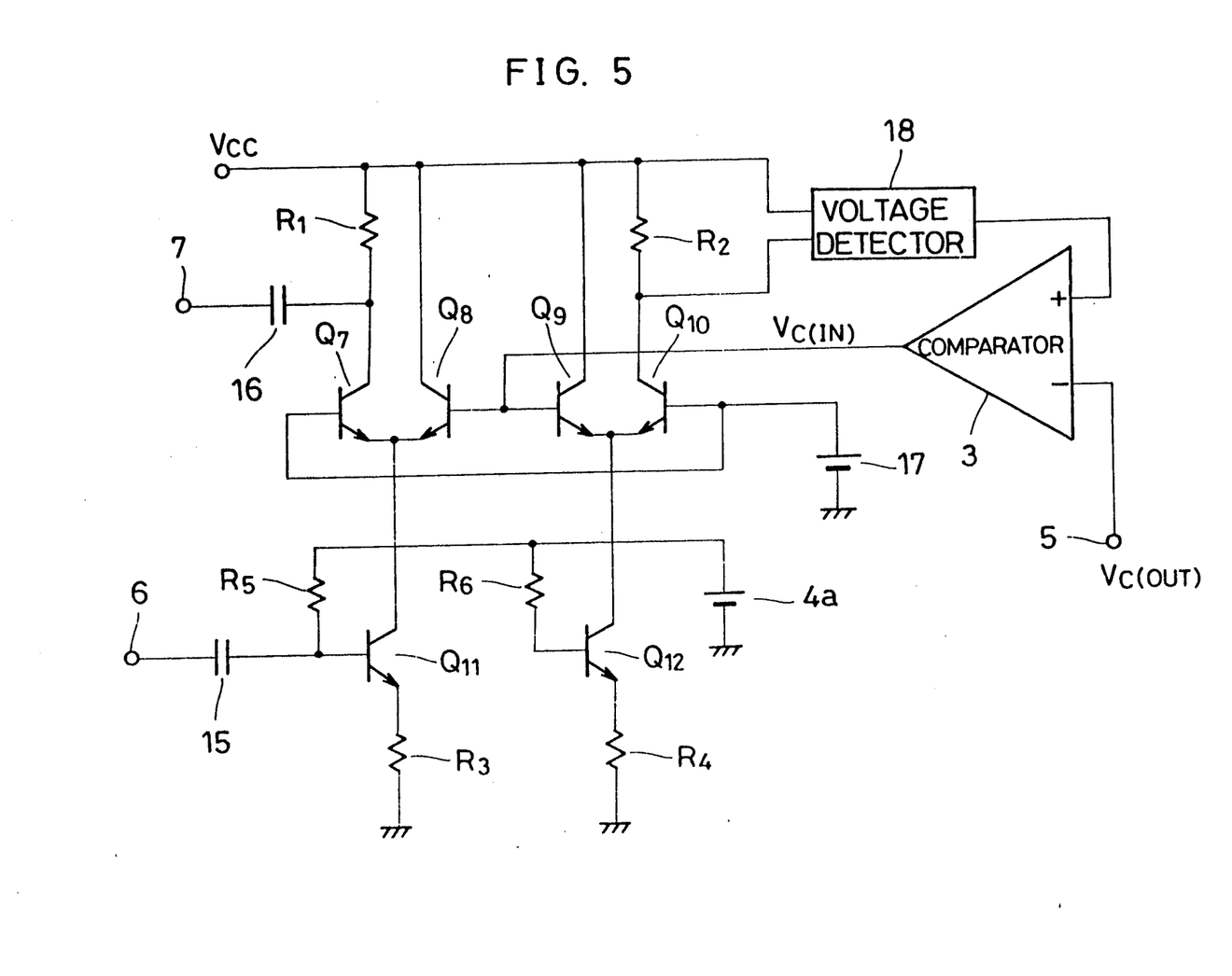

Preferably, the operational conditions of the transistors $Q_7$–$Q_{10}$ are the same in order to completely equalize the variable gain characteristics at the current distributors (or the variable gain portions) 9 and 12. Accordingly, it is preferable that the current of the signal current supplied from the voltage-to-current converter 8 when no signals are input is equal to the constant current supplied from the voltage-to-current converter 11. This can be achieved by employing a bias voltage source in common to the transistors $Q_{11}$ and $Q_{12}$ as shown in FIG. 5. In FIG. 5, the bases of the transistors $Q_{11}$ and $Q_{12}$ are connected to a common bias voltage source 4a through the resistors $R_5$ and $R_6$, respectively. The bias voltage source 4a acts as both the reference voltage source 4 and bias voltage source 14 in the circuit of FIG. 4. Preferably, the elements having the same sizes and electrical characteristics are employed as transistors $Q_{11}$ and $Q_{12}$. As for the resistors $R_1$–$R_6$, it is preferable that the corresponding resistors have the same resistance values, because it results in the approach of the operational conditions of the transistors $Q_7$–$Q_{10}$.

Figure 6:
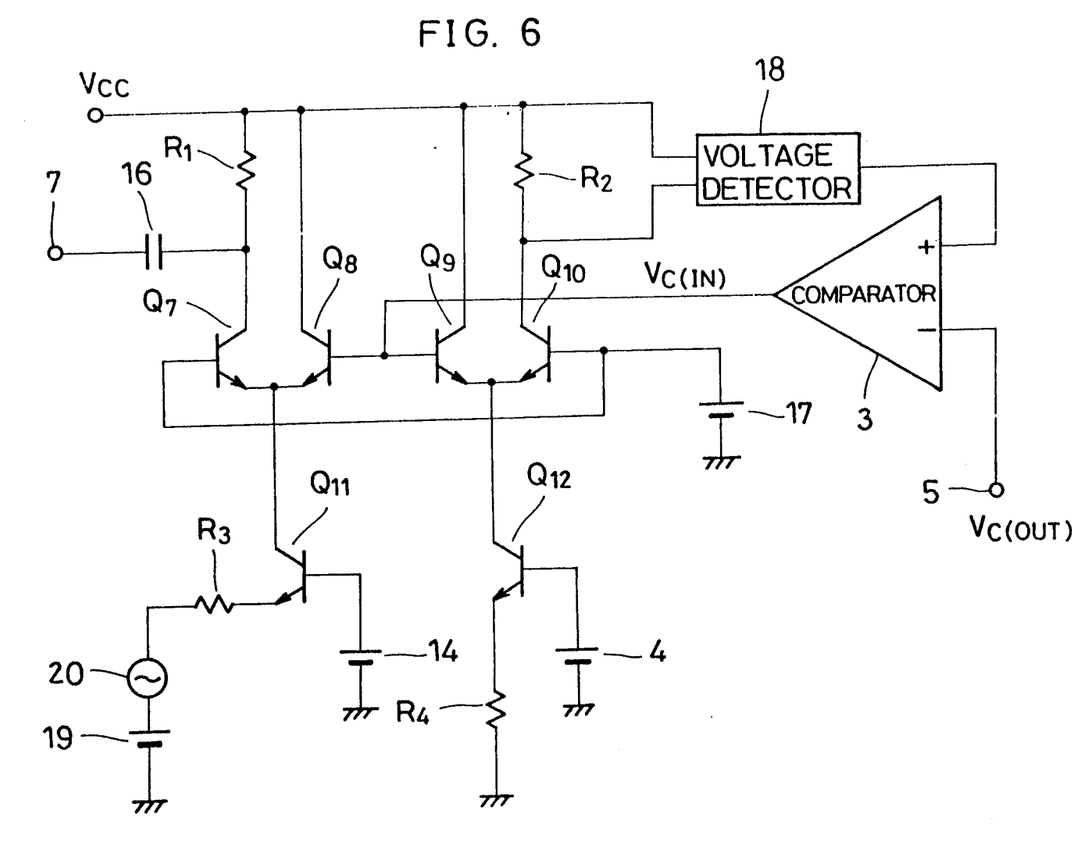

The variable gain amplifier according to the present invention has a large degree of freedom for design, thereby circuitry depending on the purposes being attainable. FIG. 6 is a circuit diagram showing a preferred embodiment in which the present invention is applied to a grounded base type amplifier. Unlike the circuit of FIG. 4, a signal source 20 of the input AC signal $v_{in}$ is connected to the emitter of the transistor $Q_{11}$, which is biased by a bias voltage source 19. The input and output show an opposite phase in the variable gain amplifier of FIG. 4, and those show the same phase in the variable gain amplifier of FIG. 6.

Figure 7:
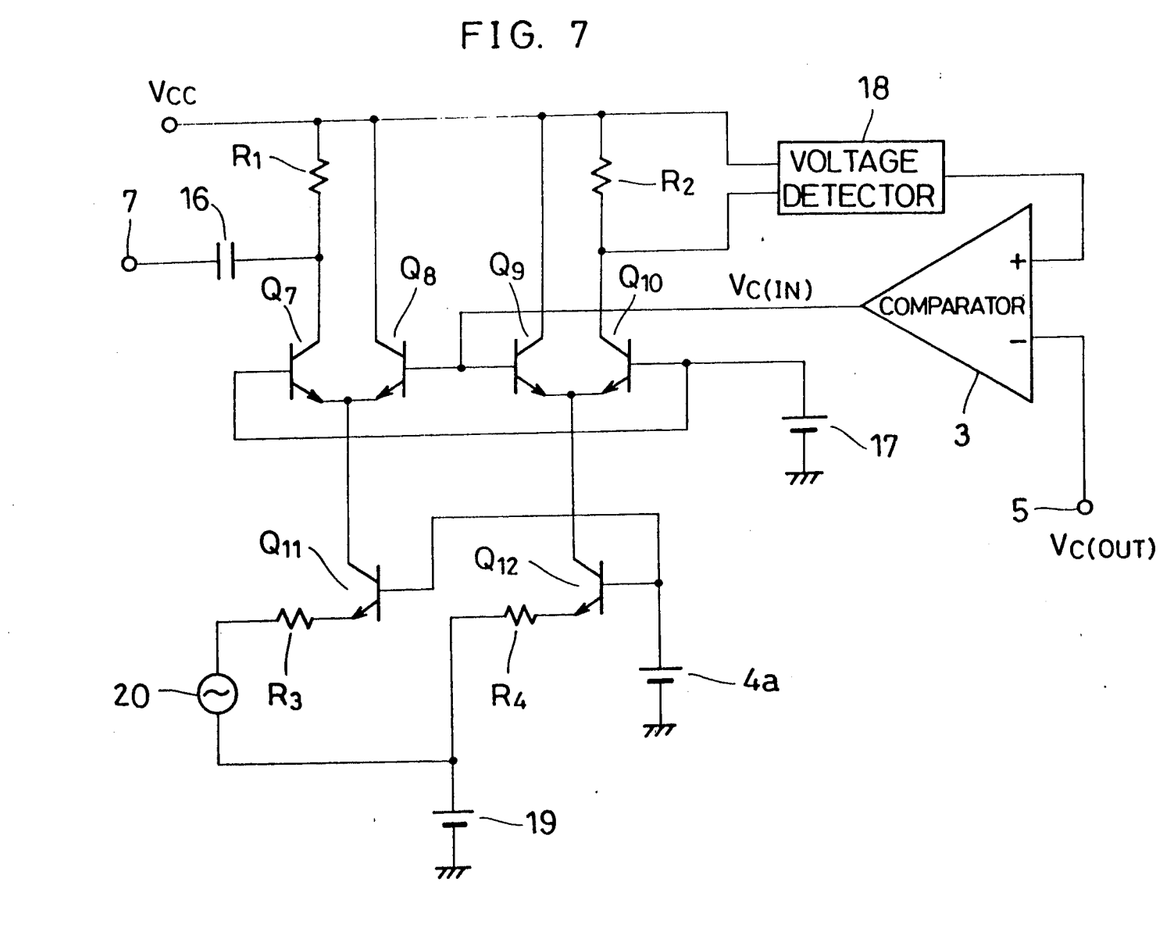

FIG. 7 shows a variable gain amplifier in which the circuit of FIG. 6 is modified to operate the transistors $Q_7$–$Q_{10}$ under the same condition. The fundamental concept is the same as the circuit of FIG. 5. That is, the reference DC voltage source 4 and the bias voltage source 14 are replaced by the common bias voltage source 4a, yet the emitter of the transistor $Q_{12}$ is biased by the bias voltage source 19. Like the case in FIG. 5, it is preferable that the corresponding transistors $Q_{11}$ and $Q_{12}$ and the corresponding resistors $R_1$, $R_2$ and $R_3$, $R_4$ have the same characteristics.

As discussed above, it is not necessarily required for the variable gain amplifier of FIG. 3 to prepare the voltage-to-current converters 8 and 11 and the current-to-voltage converters 10 and 13 which have completely the same characteristics. It is enough that the current distributors 9 and 12 as variable gain portions have the same characteristics. In particular, in the case where a specific performance is required for the first amplifier 1 for amplifying the input signal, it is sometimes impossible or extremely costly to prepare the second amplifier 2 having completely the same performance. In such a case, it is also possible to provide the current-to-voltage converters 10 and 13 having completely different circuitry, as shown in FIGS. 8 and 9.

Figure 8:
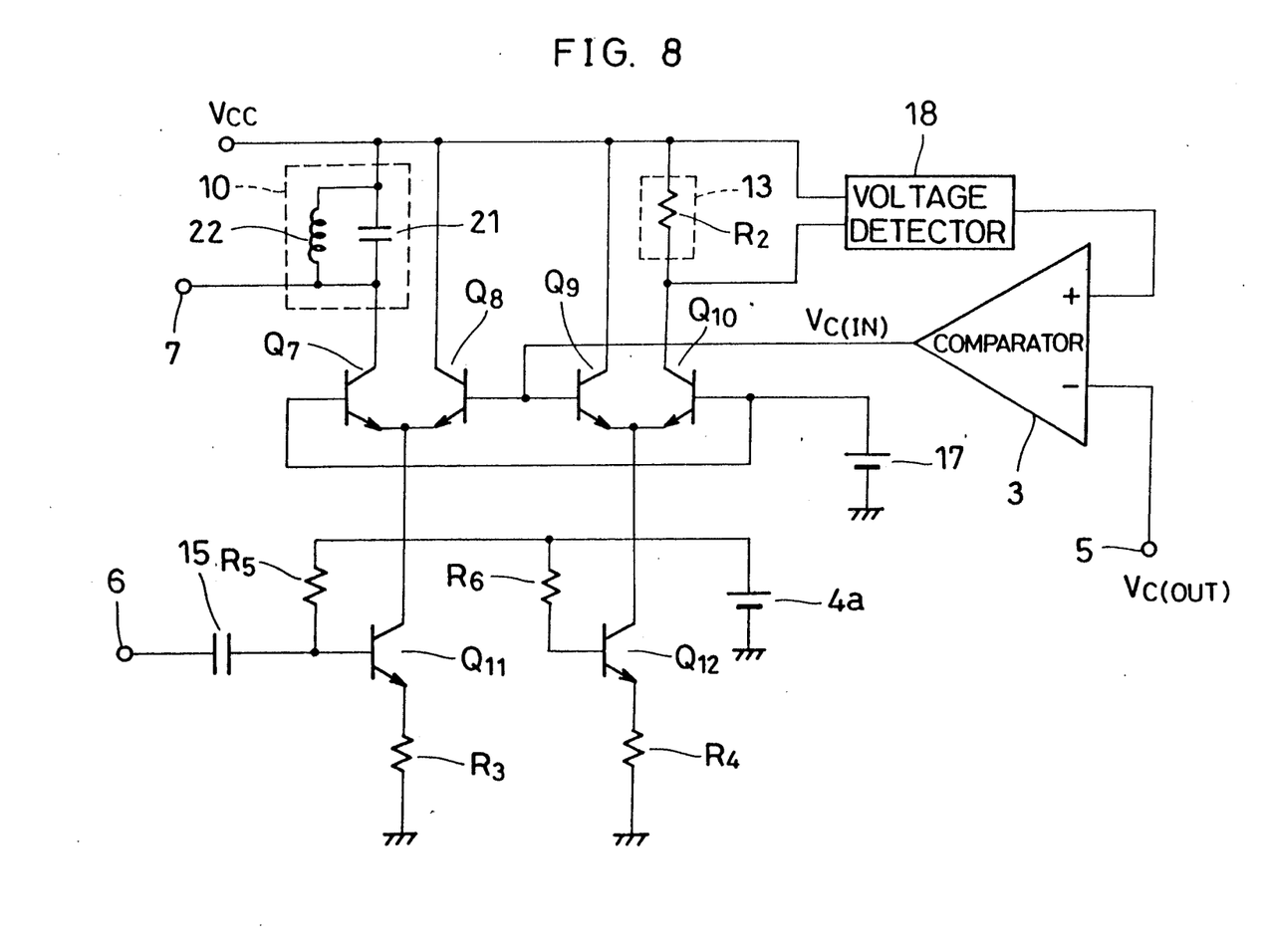

In a variable gain amplifier shown in FIG. 8, differently from the circuit of FIG. 4, the current-to-voltage converter 10 is an LC load comprising a capacitance 21 and an inductance 22. The capacitance 21 and the inductance 22 are connected in parallel, and one end thereof is connected to the power source $V_{CC}$ while the other end thereof is connected to the collector of the transistor $Q_7$ and to the output terminal 7. Thus, a tuning amplifier can be obtained in which the gain changes in complete proportion to the external control voltage $V_{C(OUT)}$.

Figure 9:
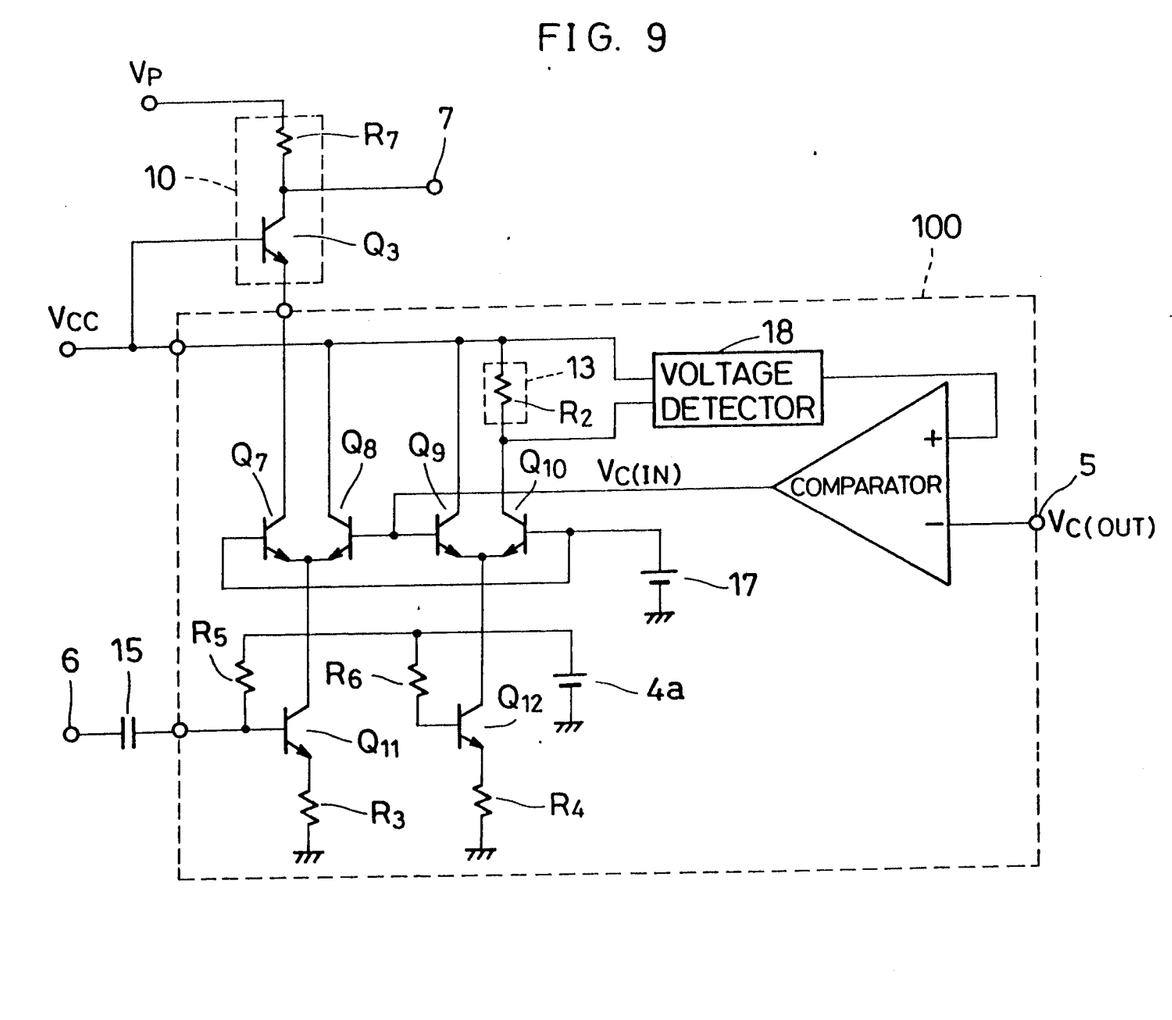

In a variable gain amplifier shown in FIG. 9, differently from the circuit of FIG. 4, the current-to-voltage converter 10 comprises a high breakdown voltage transistor $Q_3$ and a resistor $R_7$. The transistor $Q_3$ and the resistor $R_7$ are attached to the outside of an integrated circuit 100, to be used. The coupling capacitance 15 for the input signal is also attached to the outside of the integrated circuit 100. The base of the transistor $Q_{13}$ is connected to the power source $V_{CC}$; the emitter thereof is connected to the collector of the transistor $Q_7$; and the collector thereof is connected to a high voltage source $V_P$ through the resistor $R_7$ and also to the output terminal 7. Thus, a high voltage output amplifier can be obtained in which the gain changes in complete proportion to the external control voltage $V_{C(OUT)}$.

Figure 10:
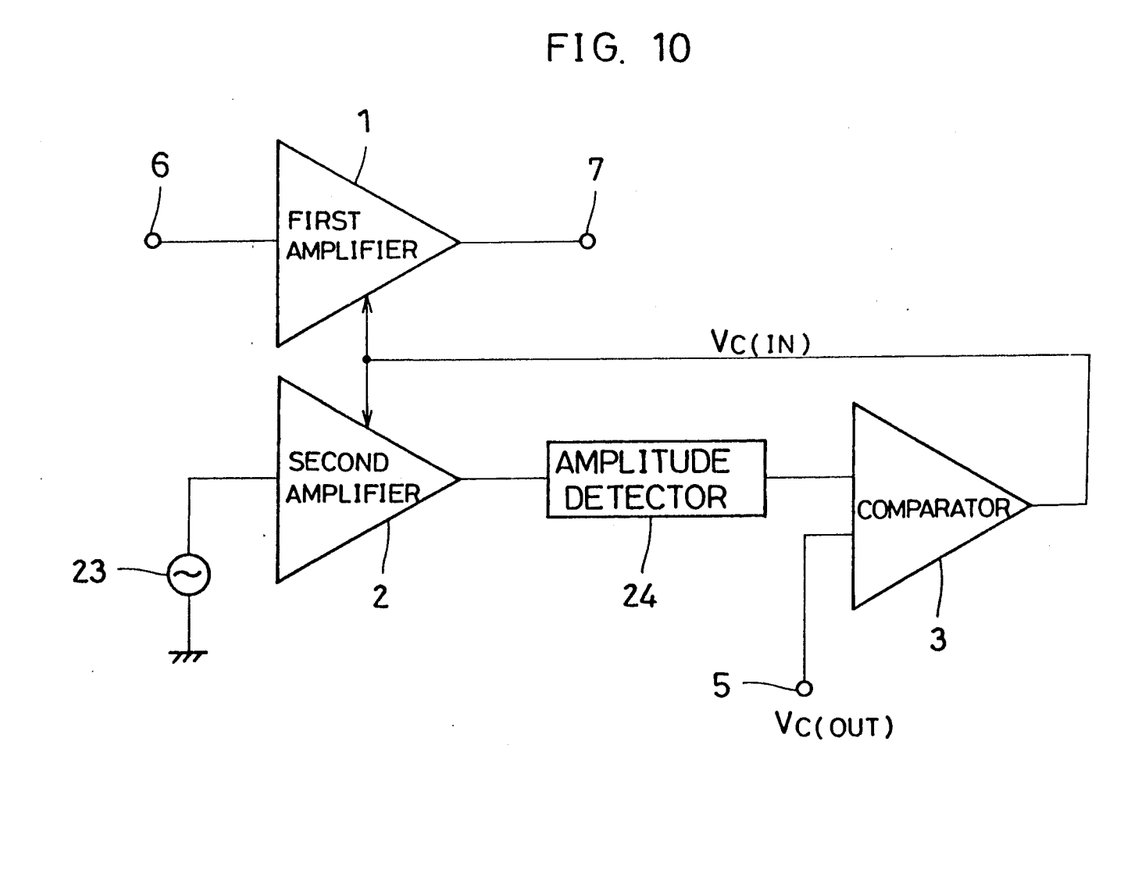
FIG. 10 is a block diagram showing another embodiment of a variable gain amplifier according to the present invention.

In the preferred embodiment ⓒf FIG. 1, a constant voltage is applied to the second amplifier 2 for detecting the gain by the reference DC voltage source 4. It is however available to replacing the reference DC voltage source 4 with a reference AC signal source 23 shown in FIG. 10 to apply an AC voltage with a constant amplitude to the second amplifier 2. In such a case, an amplitude detector 24 is provided on the output side of the second amplifier 2. The amplitude of an AC signal outputted from the second amplifier 2 is detected by the amplitude detector 24 and is supplied to the comparator 3 as a voltage signal corresponding to the gain of the second amplifier 2. Thereby, the same operation is performed as the preferred embodiment of FIG. 1.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A variable gain amplifier, comprising:
   first input means for receiving an input signal to be amplified;
   second input means for receiving an external control voltage;
   signal applying means for applying a reference signal;
   a first amplifier, including a first variable gain portion for providing a gain corresponding to an internal control voltage, for amplifying said input signal from said first input means in accordance with the gain of said first variable gain portion to output as an output signal said input signal amplified;

a second amplifier, including e second variable gain portion for providing a gain corresponding to said internal control voltage, the second variable gain portion having the same variable gain characteristic as said first variable gain portion, for amplifying said reference signal from said signal applying means in accordance with the gain of said second variable gain portion to output said reference signal amplified; and a voltage comparator, one input thereof receiving said external control voltage from said second input means, the other input thereof receiving an output from said second amplifier and an output voltage thereof being applied as said internal control voltage to said first and second variable gain portions of said first and second amplifiers, thereby for forming a negative feedback loop with said second amplifier.

2. A variable gain amplifier in accordance with claim 1, wherein
said signal applying means includes a reference DC voltage source.

3. A variable gain amplifier in accordance with claim 1, wherein
the gains of said first and second amplifier monotonously increase, and
said one input of said voltage comparator is a positive input and said other input of said voltage comparator is a negative input.

4. A variable gain amplifier in accordance with claim 1, wherein
the gains of said first and second amplifier monotonously decrease, and
said one input of said voltage comparator is a negative input ad said other input of said voltage comparator is a positive input.

5. A variable gain amplifier in accordance with claim 1, wherein
said first amplifier comprises
a first voltage-to-current converter for voltage-to-current converting the input signal supplied to said first input means,
a first current distributor serving as said first variable gain portion for distributing an output current from said first voltage-to-current converter according to said internal control voltage, and
a first current-to-voltage converter for current-to-voltage converting an output current from said first current distributor to output its output voltage as said output signal,
said second amplifier comprises
a second voltage-to-current converter for voltage-to-current converting said reference signal from said signal applying means,
a second current distributor serving as said second variable gain portion for distributing an output current from said second voltage-to-current converter according to said internal control voltage, and
a second current-to-voltage converter for current-to-voltage converting an output current from said second current distributor to supply its output voltage to said other input of said voltage comparator.

6. A variable gain amplifier in accordance with claim 5, wherein
said first and second current distributors have the same current distribution characteristic.

7. A variable gain amplifier in accordance with claim 5, wherein
said first voltage-to-current converter comprises
a first transistor having a base supplied with said input signal, and
a first resistor connected with an emitter of said first transistor,
said second voltage-to-current converter comprising
a second transistor having a base supplied with said reference signal, and
a second resistor connected with an emitter of said second transistor.

8. A variable gain amplifier in accordance with claim 7, further comprising
a bias voltage source coupled with the base of said first transistor.

9. A variable gain amplifier in accordance with claim 8, wherein
said bias voltage source is also coupled with the base of said second transistor to provide said reference signal.

10. A variable gain amplifier in accordance with claim 5, wherein
said first voltage-to-current converter comprises
a first transistor,
a first resistor having one end connected with an emitter of said first transistor and the other end receiving said input signal, and
a first bias voltage source connected with a base of said first transistor.
said second voltage-to-current converter comprising
-- a second transistor having a base supplied with said reference signal, and
a resistor connected with an emitter of said second transistor.

11. A variable gain amplifier in accordance with claim 10, wherein
said first bias voltage source is also connected with the base of said second transistor to provide said reference signal.

12. A variable gain amplifier in accordance with claim 10, further comprising
a second bias voltage source coupled with said other end of said first resistor.

13. A variable gain amplifier in accordance with claim 12, wherein
said second bias voltage source is also coupled with the emitter of said second transistor through said second resistor.

14. A variable gain amplifier in accordance with claim 5, wherein
said first current distributor comprises first and second transistors having a common emitter connected with said first voltage-to-current converter, and
said second current distributor comprises third and fourth transistors having a common emitter connected with said second voltage-to-current converter,
bases of said first and fourth transistors being supplied with a common reference voltage by a common reference voltage source,
bases of said second and third transistors being supplied with said internal control voltage.

15. A variable gain amplifier in accordance with claim 14, wherein
said first current-to-voltage converter includes a first resistor connected with a collector of said first transistor, and
said second current-to-voltage converter includes a second resistor connected with a collector of said fourth transistor.

16. A variable gain amplifier in accordance with claim 15, further comprising
a voltage detector for detecting a voltage across said second resistor to output said voltage detected to said voltage comparator.

17. A variable gain amplifier in accordance with claim 14, wherein
said first current-to-voltage converter includes an LC load connected with a collector of said first transistor, said LC load comprising a capacitance and an inductance connected in parallel with each other, and
said second current-to-voltage converter includes a resistor connected with a collector of said fourth transistor.

18. A variable gain amplifier, comprising:
first input means for receiving an input signal to be amplified;
second input means for receiving an external control voltage;
signal applying means for applying a reference signal;
a first amplifier, including a first variable gain portion for providing a gain corresponding to an internal control voltage, for amplifying said input signal from said first input means in accordance with the gain of said first variable gain portion to output as an output signal said input signal amplified;
a second amplifier, including a second variable gain portion for providing a gain corresponding to said internal control voltage, the second variable gain portion having the same variable gain characteristic as said first variable gain portion, for amplifying said reference signal from said signal applying means in accordance with the gain of said second variable gain portion to output said reference signal amplified; and
a voltage comparator, one input thereof receiving said external control voltage from said second input means, the other input thereof receiving an output from said second amplifier and an output voltage thereof being applied as said internal control voltage to said first and second variable gain portions of said first and second amplifiers, thereby for forming a negative feedback loop with said second amplifier;
wherein said first amplifier comprises:
a first voltage-to-current converter for voltage-to-current converting the input signal supplied to said first input means,
a first current distributor serving as said first variable gain portion for distributing an output current from said first voltage-to-current converter according to said internal control voltage, and
a first current-to-voltage converter for current-to-voltage converting an output current from said first current distributor to output its output voltage as said output signal,
wherein said second amplifier comprises:
a second voltage-to-current converter for voltage-to-current converting said reference signal from said signal applying means,
a second current distributor serving as said second variable gain portion for distributing an output current from said second voltage-to-current converter according to said internal control voltage, and
a second current-to-voltage converter for current-to-voltage converting an output current from said second current distributor to supply its output voltage to said other input of said voltage comparator;
wherein said first current distributor comprises first and second transistors having a common emitter connected with said first voltage-to-current converter, and
said second current distributor comprises third and fourth transistors having a common emitter connected with said second voltage-to-current converter,
bases of said first and fourth transistors being supplied with a common reference voltage by a common reference voltage source,
bases of said second and third transistors being supplied with said internal control voltage;
wherein said first current-to-voltage converter comprises a high breakdown voltage transistor having an emitter connected with a collector of said first transistor and a base biased, and a first resistor connected with a collector of said high breakdown voltage transistor,
said second current-to-voltage converter includes a second resistor connected with a collector of said fourth transistor.

19. A variable gain amplifier, comprising:
first input means for receiving an input signal to be amplified;
second input means for receiving an external control voltage;
signal applying means for applying a reference signal;
a first amplifier, including a first variable gain portion for providing a gain corresponding to an internal control voltage, for amplifying said input signal from said first input means in accordance with the gain of said first variable gain portion to output as an output signal said input signal amplified;
a second amplifier, including a second variable gain portion for providing a gain corresponding to said internal control voltage, the second variable gain portion having the same variable gain characteristic as said first variable gain portion, for amplifying said reference signal from said signal applying means in accordance with the gain of said second variable gain portion to output said reference signal amplified; and
a voltage comparator, one input thereof receiving said external control voltage from said second input means, the other input thereof receiving an output from said second amplifier and an output voltage thereof being applied as said internal control voltage to said first and second variable gain portions of said first and second amplifiers, thereby for forming a negative feedback loop with said second amplifier;
wherein said signal applying means includes a reference AC signal source, and
said variable gain amplifier further comprises an amplitude detector for detecting an amplitude of an AC signal output from said second amplifier to supply the amplitude detected to said voltage comparator.

* * * * *